(12) United States Patent
Steinle et al.

(10) Patent No.: US 6,717,972 B2
(45) Date of Patent: Apr. 6, 2004

(54) VCSEL WITH MONOLITHICALLY INTEGRATED PHOTODETECTOR

(75) Inventors: Gunther Steinle, München (DE); Hans-Dietrich Wolf, Hohenbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/211,102

(22) Filed: Aug. 2, 2002

(65) Prior Publication Data

US 2003/0021322 A1 Jan. 30, 2003

Related U.S. Application Data

(63) Continuation of application No. PCT/DE01/00352, filed on Jan. 30, 2001.

(30) Foreign Application Priority Data

Feb. 2, 2000 (DE) .......................................... 100 04 398

(51) Int. Cl.[7] .................................................. H01S 5/00
(52) U.S. Cl. .......................................... 372/50; 372/45
(58) Field of Search .............................. 372/96, 45, 50

(56) References Cited

U.S. PATENT DOCUMENTS

| | | | | |
|---|---|---|---|---|
| 5,136,603 A | * | 8/1992 | Hasnain et al. | 372/50 |
| 5,577,064 A | | 11/1996 | Swirhun et al. | |
| 5,606,572 A | * | 2/1997 | Swirhun et al. | 372/96 |
| 5,742,630 A | * | 4/1998 | Jiang et al. | 372/50 |
| 5,757,837 A | | 5/1998 | Lim et al. | |
| 5,892,786 A | * | 4/1999 | Lott | 372/50 |
| 6,026,108 A | * | 2/2000 | Lim et al. | 372/50 |

FOREIGN PATENT DOCUMENTS

| | | |
|---|---|---|
| DE | 198 07 783 A1 | 9/1999 |
| EP | 0 565 374 A1 | 10/1993 |
| EP | 0 899 836 A1 | 3/1999 |

OTHER PUBLICATIONS

Lim, S. F. et al.: "Modulation of a Vertical–Cavity Surface–Emitting Laser Using An Intracavity Quantum–Well Absorber", IEEE Photonics Technology Letters, vol. 10, No. 3, Mar. 1998, pp. 319–321.
Hasnain, G. et al.: "Monolithic Integration of Photodetector With Vertical Cavity Surface Emitting Laser", Electr. Letters, vol. 27, No. 18, Jul. 4, 1991, pp. 1630–1632.
Shin, H.–K. et al.: "Vertical–Cavity Surface–Emitting Lasers for Optical Data Storage", Jpn. J. Appl. Phys., vol. 35, 1996, pp. 506–507, no month.
Lim, S. F. et al.: "Intracavity Quantum–Well Photodetection of a Vertical–Cavity Surface Emitting Laser", Proc. Int. S.C.–Laser Conf. Haifa–Israel, Oct. 1996, pp. 183–184.
Lott, J. A. et al.: "Deep Red Vertical Cavity Surface Emitting Lasers With Monolithically Integrated Heterojunction Phototransistors For Output Power Control", Proc. Int. S.C.–Laser Conf. Haifa–Israel, Oct. 1996, pp. 185–186.
Kim, T. et al.: "A Single Transverse Mode Operation of Top Surface Emitting Laser Diode With a Integrated Photo-Diode", IEEE, Oct. 1995, pp. 416–417.
Han, I. Y. et al.: "Oxide–Apertured Photodetector Integrated on VCSEL", Proc. CLEO, 1999, p 176, no month.
Ortiz, G. G. et al.: "Monolithic Integration of $In_{0.2}Ga_{0.8}As$ Vertical–Cavity Surface–Emitting Lasers With Resonance–Enhanced Quantum Well Photodetectors", IEE, Bd. 32, Nr. 13, Jan. 5, 1996, pp. 1205–1207.

* cited by examiner

*Primary Examiner*—Paul Ip
*Assistant Examiner*—Hung Vy
(74) *Attorney, Agent, or Firm*—Laurence A. Greenberg; Werner H. Stemer; Ralph E. Locher

(57) ABSTRACT

A VCSEL has an active layer, a photodetector in one of the DBR gratings and with a radiation-absorbing layer that is arranged in an antinode of a laser mode. The laser and the photodetector are electrically driven by a common contact on a thick, heavily doped spacer layer that ensures low laser impedance and little electrical crosstalk between the laser and the photodetector.

15 Claims, 3 Drawing Sheets

VCSEL WITH MONOLITHICALLY INTEGRATED PHOTODETECTOR

CROSS-REFERENCE TO RELATED APPLICATION

This application is a continuation of copending International Application No. PCT/DE01/00352, filed Jan. 30, 2001, which designated the United States and was not published in English.

BACKGROUND OF THE INVENTION

Field of the Invention

The present invention relates to VCSELs (vertical cavity surface emitting lasers) that can be used for optical transmission links with high data rates and that have a photodetector that is monolithically integrated in the resonator between the resonator end mirrors (Distributer Bragg Reflector (DBR) gratings).

The electrical and optical properties of laser diodes, for example, the threshold current and the differential efficiency, vary from component to component. The properties of each component depend on the temperature, and they are subject to long- and short-term fluctuations. For this reason, it is necessary to provide an electrical feedback signal, which gives direct information about the actual optical output power of the laser and which can be used to regulate both the DC bias voltage and the modulation depth of the laser current during transmission. The costs associated with constructing a device for injecting an admittedly small, but nevertheless non-negligible part of the laser radiation into an external photodetector have led to the development of monolithically integrated components.

A range of structures with monolithically integrated photodetectors in the Bragg gratings that are used as a reflector are described in the publications by T. Kim et al.: "A Single Transverse Mode Operation of Top Surface Emitting Laser Diode with an Integrated photo-diode" in Proc. LEOS 1995, pp. 416–417, October 1995; by S. F. Lim et al.: "Intracavity Quantum-Well Photodetection of a Vertical-Cavity Surface-Emitting Laser" in Proc. Int. S. C.-Laser Conf. October 1996, Haifa/Israel, pp. 183–184; and by J. A. Lott et al.: "Deep Red Vertical Cavity Surface Emitting Lasers With Monolithically Integrated Heterojunction Phototransistors For Output Power Control" in Proc. Int. S. C.-Laser Conf. October 1996, Haifa/Israel, pp. 185–186. Further sources are U.S. Pat. Nos. 5,757,837, 5,742,630, 5,577,064, 5,606,572 and 5,136,603.

The published laser structures with integrated photodetectors do not satisfy all of the following minimum conditions: easy production without losing yield on the wafer; good contrast in relation to spontaneous emission and ambient light, so that both the laser threshold and the differential efficiency can be established; few or no additional requirements in terms of the voltage that will be applied for the overall system; reproducible and frequency-independent feedback properties and only minor alteration of the optical and electrical properties over long operating times (deterioration).

Photodetectors in the semiconductor resonator are virtually insensitive to ambient light or scattered light. Since the detector properties of these photodetectors are predominantly based on the properties of the epitaxial layer growth, a good yield of functional components can be achieved even when fabricating with large tolerances. In order to produce components whose photodetectors provide a good contrast in relation to spontaneous emission, either the active detector region may be reduced to the size of the laser spot, although this raises additional technical problems and therefore reduces the yield (I. Y. Han, Y. H. Lee: "Oxide-apertured photo-detector integrated on VCSEL" in Proc. CLEO '99, p. 176), or the sensitivity in relation to the coherent light in comparison with the spontaneous emission may be increased by a thin absorbing region at an antinode of the standing wave. By reducing the distance of this thin absorbing region from the active region, the contrast in relation to spontaneous emission can be increased further. However, this also increases the absorption of the laser radiation, so that the differential efficiency is reduced, which leads to very high sensitivities of the detector of about 1 A/W.

Another problem, in an integrated component, is avoiding higher laser impedances in comparison with an individual VCSEL, and therefore avoiding difficulties when using a driver circuit for the radiofrequency modulation of the laser current. Furthermore, electrical crosstalk between the laser and the detector must be minimized if unmodified RF components of the monitor signal are needed, for example, to adjust the DC bias voltage and the modulation depth.

SUMMARY OF THE INVENTION

It is accordingly an object of the invention to provide a VCSEL which overcomes the above-mentioned disadvantages of the prior art apparatus of this general type.

In particular, it is an object of the invention to provide an improved VCSEL with a monolithically integrated photodetector, that is straightforward to produce and that has a sufficiently low laser impedance, little crosstalk and good contrast in relation to spontaneous emission.

With the foregoing and other objects in view there is provided, in accordance with the invention, an optoelectronic component serving as a VCSEL, including: DBR gratings serving as reflectors; an active layer intended for generating radiation between the DBR gratings; a photodetector provided with a radiation-absorbing layer inside one of the DBR gratings, the radiation-absorbing layer being configured to overlap an antinode of a laser mode of the radiation that is generated; and a thick and heavily doped spacer layer located between the active layer and the radiation-absorbing layer.

In accordance with an added feature of the invention, the laser mode has a photon energy; and the radiation-absorbing layer has an energy band edge that is slightly lower than the photon energy of the laser mode.

In accordance with an additional feature of the invention, the photodetector and the spacer layer have a nonresonant optical thickness with respect to the laser mode so that an electric field distribution of the radiation inside the DBR gratings remains unmodified.

In accordance with another feature of the invention, the laser mode has a photon energy; and the spacer layer has an energy band edge that is slightly higher than the photon energy of the laser mode.

In accordance with a further feature of the invention, at least one semiconductor layer adjoins the radiation-absorbing layer and is heavily doped to be n-type conductive; and the spacer layer is heavily doped to be n-type conductive.

In accordance with a further added feature of the invention, there is provided, a region adjacent the radiation-absorbing layer; and at least one semiconductor layer adjoining the radiation-absorbing layer and having a grading in an energy band gap so that in the region adjacent the radiation-absorbing layer, the energy band gap grows toward the spacer layer.

In accordance with a further additional feature of the invention, there is provided, a depletion layer; and a device for applying an electrical voltage to modify the absorption in the radiation-absorbing layer. The radiation-absorbing layer lies inside the depletion layer.

In accordance with yet an added feature of the invention, there is provided, a depletion layer having an n-doped edge region; and a structural device for applying an electrical voltage to modify the absorption in the radiation-absorbing layer. The radiation-absorbing layer lies close to the n-doped edge region of the depletion layer.

In accordance with yet an additional feature of the invention, the photodetector is a pin photodiode.

In accordance with yet another feature of the invention, the photodetector is a bipolar phototransistor or a heterobipolar phototransistor.

In accordance with yet a further feature of the invention, the photodetector includes two photodiodes that have a common anode.

In accordance with an added feature of the invention, the photodetector includes two photodiodes that have a common cathode.

In accordance with an additional feature of the invention, the photodetector includes two photodiodes that have a common tunnel contact.

The component is a VCSEL with a photodetector, which is integrated in one of the DBR gratings that are provided as resonator mirrors, so that no mechanical adjustment of an external monitor diode is necessary. An active region, which is intended for radiation generation, is situated between the DBR reflectors. The coherent radiation generated in the resonator is emitted at the surface of the component. The photodetector in one of the DBR reflectors includes a thin absorbing layer, which is arranged in the vicinity of an antinode of the standing wave of a laser mode. The energy band edge of the material in the thin absorbing region is selected to be slightly lower than the energy that corresponds to the frequency of the emitted radiation, in order to prevent an irreproducible response of the detector, but without absorbing the low-energy part of the spontaneous emission.

The laser and the photodetector are electrically driven by a common electrode, preferably an n-type contact. This contact is situated on a spacer layer, which is doped with n-type conductivity at a dopant concentration that is sufficient to guarantee a low ohmic impedance inside the layer, and also to ensure a good ohmic metal-semiconductor contact. This spacer layer ensures a low laser impedance and little electrical crosstalk between the laser and the photodetector.

This spacer layer, or a further layer between the laser-active region and the photodetector, is preferably selected in such a way that the coherent light passes through this layer, but the high-energy part of the spontaneous emission is absorbed, so that a lowpass filter is thereby formed for the spontaneous emission. Together with the property of the thin absorbing region that it form a highpass filter, a bandpass filter is hence formed overall. The transmission range of the bandpass filter lies around the laser radiation frequency and hence further increases the contrast in relation to spontaneous emission.

Other features which are considered as characteristic for the invention are set forth in the appended claims.

Although the invention is illustrated and described herein as embodied in a VCSEL With Monolithically Integrated Photodetector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
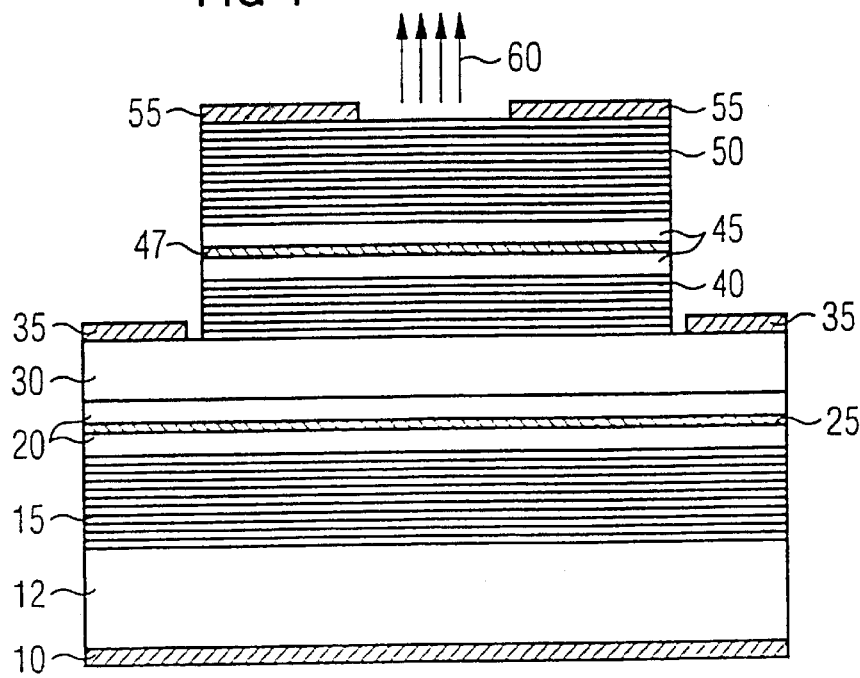
FIG. 1 is a cross sectional view taken through an exemplary embodiment of a component.
Figure 2:
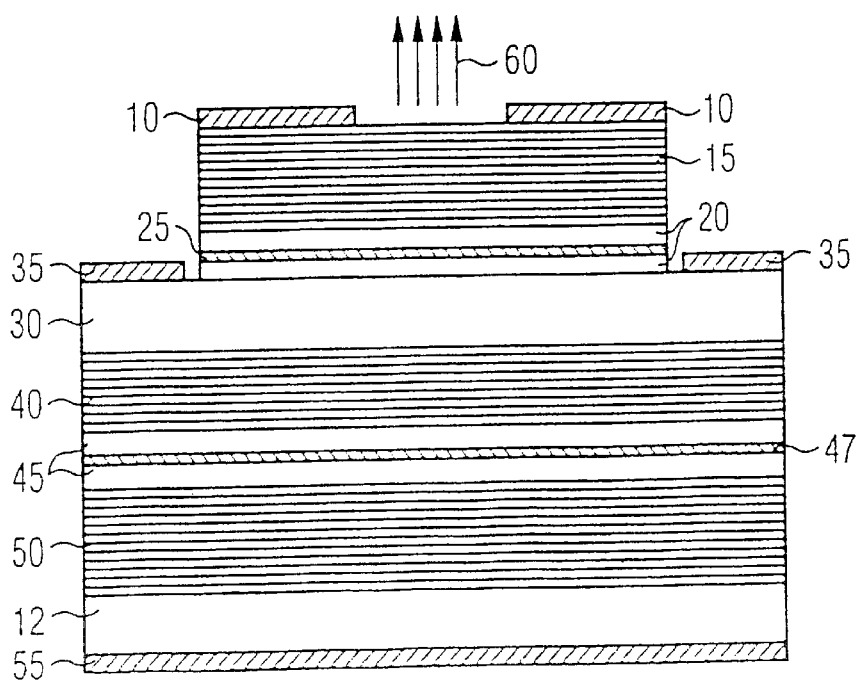
FIG. 2 is a cross sectional view taken through a further exemplary embodiment of the component.

Referring now to the figures of the drawing in detail and first, particularly, to FIG. 1 thereof, there is shown a cross sectional view of a preferred embodiment of an inventive component with a photodetector between a substrate and the radiation-generating active region. FIG. 2 shows a corresponding cross sectional view of a component in which the photodetector is arranged on the other side of the active region from the substrate. In the exemplary embodiment shown in FIG. 1, the following are situated above one another on a substrate 12, which has a backside contact 10 and is preferably doped with p-type conductivity: a first part 15, doped with p-type conductivity in this example, of a lower first DBR (Distributer Bragg Reflector) grating, an intrinsically conductive region 20 of the photodetector with a thin absorption layer 25 arranged in it, a spacer layer 30, which is heavily doped with n-type conductivity, a second part 40, doped with n-type conductivity, of the first DBR grating, a laser-active region 45 with an active layer 47 formed in it, and an upper second DBR grating doped with p-type conductivity. The active region 45, 47 is preferably designed as an SCH (separate confinement heterostructure). On the spacer layer 30, in this example, there is an annular contact 35 which is arranged in a ring around a mesa of semiconductor material, in which the upper part 40 of the first DBR grating, the active region 45, 47 and the second DBR grating 50 are situated.

The absorption edge of the energy band is selected to be slightly lower in the absorbtion layer 25 than the energy of the coherent light of the generated laser mode. The laser radiation of the mode can be detected reliably in this way, without simultaneously picking up the low-energy part in the spontaneous emission. For a laser energy of, for example, 1460 meV, the absorption edge may be selected at about 1450 meV. In this example, the thin absorption layer is typically about 7 nm thick and is designed as an InGaAs potential well with an indium content of a few percent. When establishing the correct absorption edge, the effect of excitons and temperature need to be taken into account. The absorption edge may, for example, be measured by using transmission spectroscopy. As the difference between the effective energy band gap and the energy of the radiation laser becomes smaller, then the part of the absorbed spontaneous emission in the upper energy range becomes smaller, and the contrast in relation to spontaneous emission becomes smaller.

The spacer layer 30 preferably has a thickness of several wavelengths of the laser radiation, and it is preferably arranged directly above the intrinsically conductive region 20 of the photodetector. The effective energy band gap of the spacer layer 30 is selected in such a way that it does not absorb the coherent radiation of the laser mode, but it does absorb the high-energy part of the spontaneous emission.

An upper annular p-type contact 55 completes the component. In principle, an optically transmissive upper contact may also be applied, which then covers the entire light output face. Alternatively, light output downward through the substrate 12 may be provided. The substrate is then formed from a semiconductor material which is transmissive for the emission wavelength. Other laser wavelengths are furthermore possible, for example, 980 nm or 1300 nm, with a correspondingly selected semiconductor material of the thin absorption layer of the photodetector. This material is slightly different from the material of the active layer, because a somewhat lower energy band gap is required in the absorbing layer than in the active layer. The signs of the doping (n-type conductivity or p-type conductivity) may be interchanged. The signs indicated in the above description, however, constitute the preferred exemplary embodiment.

The monitor function of the photodetector does not depend on the polarization direction or the properties of the transverse modes of the VCSEL. Variation of the active region or the shape of the mesa structure, with the active region present in it, lies within the scope of the invention.

In another preferred embodiment shown in FIG. 2, the positions of the SCH structure 45 with the active layer 47, and of the photodetector region with the intrinsically conductive layer 20 and the thin absorption layer 25, are interchanged with one another. The photodetector is situated above the thick n-doped spacer layer 30. The active region with the active layer 47 is situated between a first part 50, doped with p-type conductivity, and a second part 40, doped with n-type conductivity, of a lower DBR grating between the spacer layer 30 and the substrate 12. Here as well, an n-type contact 35 is applied to the spacer layer 30. The photodetector 20, 25 is arranged inside the strip-shaped mesa structure, specifically below an upper DBR grating 15 doped with p-type conductivity. The detector anode is formed by a p-type contact 10 on the top side. For this contact, the explanations given regarding the exemplary embodiment shown in FIG. 1 similarly apply.

A substantial advantage of the inventive component is that the effective photodetector region can be reduced, which provides a better contrast in relation to spontaneous emission and a lower photodetector capacitance. A high detector speed is thereby achieved. Small laser capacitances can be achieved by forming the structure intended for the laser inside the exemplary embodiment shown in FIG. 2 with dimensions which are as small as possible, but which need to be larger than the dimensions of the mesa of the photodetector. Dry etching methods are preferably used for production.

The n-type contact 35 applied to the spacer layer 30 need not be an annular contact. Because of the low ohmic impedance of the spacer layer 30, which is doped heavily enough with n-type conductivity, asymmetric lateral charge-carrier injection is also possible without impairing the laser properties. The contact 35 may therefore be applied to a lateral top side of the spacer layer 30, outside the region of the mesa with the photodetector. The lower part of the structure with the laser-active region may then also be designed as a mesa with dimensions almost as small as the dimensions of the photodetector region.

The other properties of the described exemplary embodiments may be designed in accordance with conventional VCSELs. Gold-metal alloys are preferred contact materials. Before the metal is applied to the semiconductor top side, the top side is freed from oxides which may possibly be present. In order to achieve good metal-semiconductor contacts, even in the event of widely varying mixed crystal compositions, which is the case, for example, in the DBR gratings, it is also necessary to take etching depth inhomogeneities into account. These inhomogeneities vary with the material system that is used, and the type of etching process (dry etching, wet etching), but they depend primarily on the uniformity of the epitaxially grown layer. In the case of AlGaAs, and of sulfuric acid and hydrogen peroxide in an aqueous solution as a wet chemical etching solution, typical inhomogeneities reach deviations of ±20 nm per micrometer of etching depth. It is difficult to achieve good and stable ohmic contacts on layers with a high or varying aluminum content. According to the invention, the component is therefore provided with a thick and homogeneous semiconductor layer, which is also heavily doped with n-type conductivity, as the spacer layer 30. Etching-depth tolerances are acceptable in this thick spacer layer 30. The layer also serves as a common low-ohmic contact layer for the laser and the photodetector.

An n-doped spacer layer adjoining the photodetector, as in the inventive component, has various advantages. Parasitic light absorption by free charge carriers is usually less in semiconductor material doped with n-type conductivity than in semiconductor material doped with p-type conductivity (at least for the majority of semiconductor materials that are normally used). In the AlGaAs material system, for example, the optical absorption in p-doped material at a wavelength of 850 nm is approximately higher by a factor of from 2.5 to 3 than in n-doped material with the same dopant concentration. A further advantage when using an n-doped spacer layer adjoining the photodetector is the correspondingly lower ohmic impedance that is achieved with n-conductive semiconductor material in comparison with p-conductive material. This is due to the higher mobility of electrons than holes, for example by a factor of about 20 in AlGaAs. If a pin photodetector without an additional tunnel junction is required (that is to say without a $p^+n^+$ junction, which behaves as an ohmic impedance when reverse biased), the DBR grating will be grown on a $p^+$ substrate, preferably using a buffer layer which is produced at a lower temperature. Instead of this, it is possible to use a conventional npn bipolar transistor with a base at a floating potential and a graded energy band gap (HBPT) as the photodetector, in which case an additional voltage is applied to the photodetector. This component can be grown on an n-type substrate. Alternatively, it is also possible to use a double diode structure with a common anode (npn) or a common tunnel contact ($npp^+n^+np$) as the detector, in which case the two photodiodes may have differing properties for compensation purposes. For instance, it is possible to increase the contrast ratio by an internal or external superposition of the photocurrents, if the detecting layer 25 of the first photodiode lies in an antinode and the detecting layer of the second photodiode lies in the node of the standing wave, and if the two photocurrents are subtracted from one another.

Figure 3:
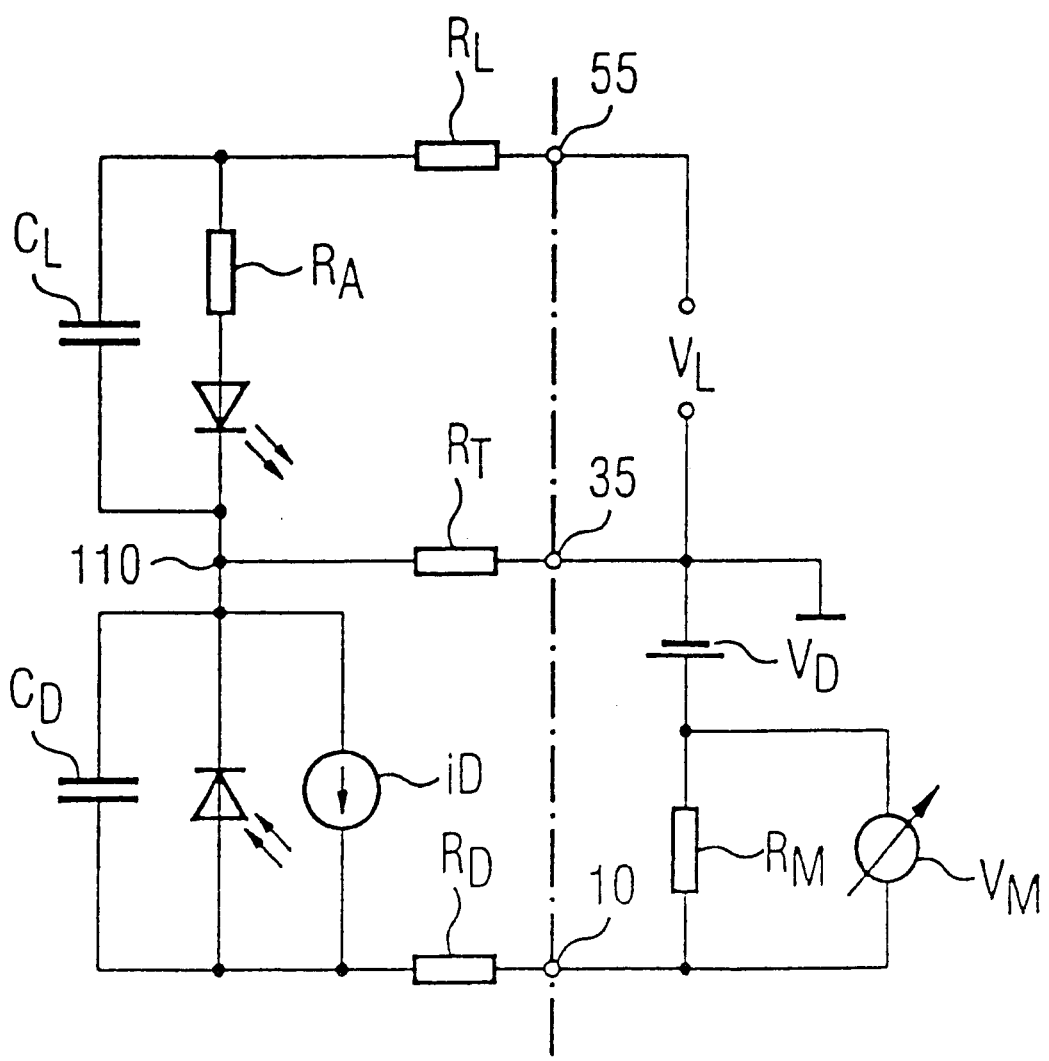
FIG. 3 shows an equivalent circuit diagram for the components shown in FIGS. 1 and 2.

FIG. 3 represents the equivalent circuit diagram for a basic structure of the inventive component, with an integrated pin photodiode corresponding to FIG. 1 or 2. The upper part of the diagram in FIG. 3 corresponds to the intrinsic laser impedance, which is primarily determined by the ohmic laser impedance $R_A$ during the operation of the laser, in parallel with the effective laser capacitance $C_L$. The lower part of the diagram reflects the capacitance $C_D$ of the photodetector in parallel with the current source $i_D$ for the photocurrent. The common n-type contact has a series resistance $R_T$ that is determined by the lateral ohmic impedance in the thick n-doped spacer layer 30. The essential dynamic quantities are the RC time constants $\tau_L$, $\tau_D$ of the laser and of the photodetector, respectively. The latter is influenced by the external measuring resistance $R_M$, and it is equal to $\tau_D = C_D (R_D + R_T + R_M)$. When there are small photodetector regions, it is possible to achieve a small photodetector capacitance, although in this case the internal resistance $R_D$ is greater ($R_D = \text{const}/C_D$), which causes an additional parasitic voltage drop that may impair the linear property of the photodetector during operation with low or vanishingly small detector voltages $V_D$.

The intrinsic RC time constant for the laser is given by $\tau_L = R_A C_L$. Apart from this, and other intrinsic quantities, for example, the laser resonant frequency and the photon lifetime, the total laser impedance $(R_L + R_A)/(C_L + R_T)$ is a very important quantity, which is added in parallel with the capacitances of a driver circuit or of a modular structure and should be kept as small as possible, in order to permit the use of inexpensive laser driver circuits.

In the case of low impedances or vanishing $C_D$, the relationship $R_T(C_L + R_T)/(R_L + R_A)$ reflects the part of the laser voltage (parasitic AC voltage at the node 110) which is also applied parasitically to the photodetector. When a photodetector with a strongly voltage-dependent sensitivity is used, for example, a phototransistor, it is preferable to have a small value RT and high applied photodetector voltages.

For electrical crosstalk between the laser and the photodetector at high frequencies, it is possible to define a coupling time constant by $\tau_{coup} = R_T C_D$. At a modulation frequency $f = 1/(2\pi\tau_{coup})$, about half of the parasitic AC voltage at the node 110 is coupled into the resistance $R_D + R_M$ via the photodetector capacitance, and it is superimposed on the photocurrent signal. In order to pick up the radiofrequency components of the photocurrent, a smaller value Of $\tau_D$ is needed. The voltage drop which is due to the photocurrent across the resistances $R_D + R_M$, however, still needs to be larger in comparison with the parasitic AC voltage, in order to minimize the crosstalk. Therefore, in order to generate good modulation properties of the laser and good radiofrequency properties of the photodetector signal, the lateral resistance $R_T$ should be as small as possible, even if a high-quality pin photodiode is being used as the photodetector.

Figure 4:
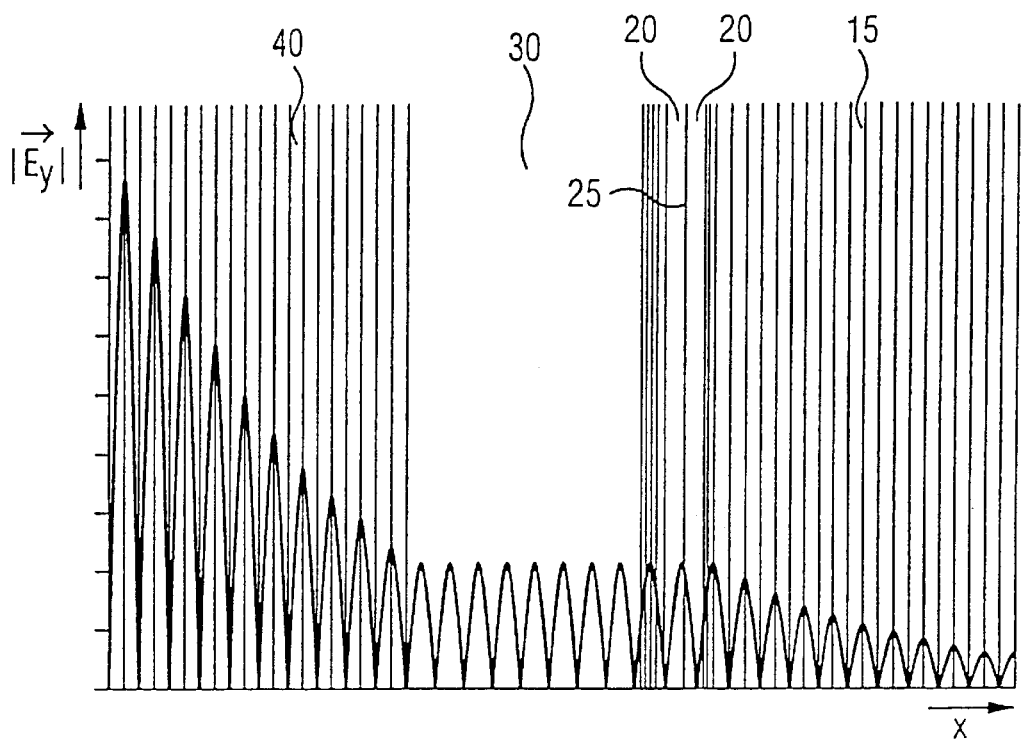
FIG. 4 is a diagram for a field distribution around the spacer layer.

The optical thickness of the photodetector region, including the thick spacer layer, in comparison with the laser wavelength, is likewise an important quantity. It determines whether or not the photodetector in the resonator will resonantly affect the laser intensity. Any photodetector may have a thin absorption layer at a particular point inside the standing-wave pattern of the coherent light. A first improvement in the detection sensitivity can be achieved by picking up only the maximum in the intensity distribution. This amplification can be quantified by using the so-called confinement factor. Further amplification is possible if the position of the detector in the DBR gratings is selected to be close to the active region. FIG. 4 represents the calculated field distribution of the coherent radiation for a special embodiment corresponding to FIG. 1 in the vicinity of the thick spacer layer.

In order to prevent the spacer layer 30 from having an unintentional resonance with respect to the laser wavelength, the thickness of the spacer layer should be approximately an odd multiple of a quarter of the laser wavelength. A nonresonant spacer layer has the advantage that the photodetector properties, for example the response, depend little on the precise thickness of the epitaxial layer. Since the spacer layer is relatively thick in comparison with the laser wavelength in the component according to the invention, accurate adjustment of the thickness of the layer is very important. During the epitaxial growth of the layers, the accuracy of the layer thickness can be improved by in-situ checks. The requisite absolute accuracy of the layer thickness is determined by a layer thickness that lies substantially below a quarter wavelength. In a special embodiment, as has been described above, a deviation of roughly ±13 nm from a total thickness of 1.3 μm for the spacer layer leads to a spread of about ±5% in the photodetector sensitivity.

Figure 5:
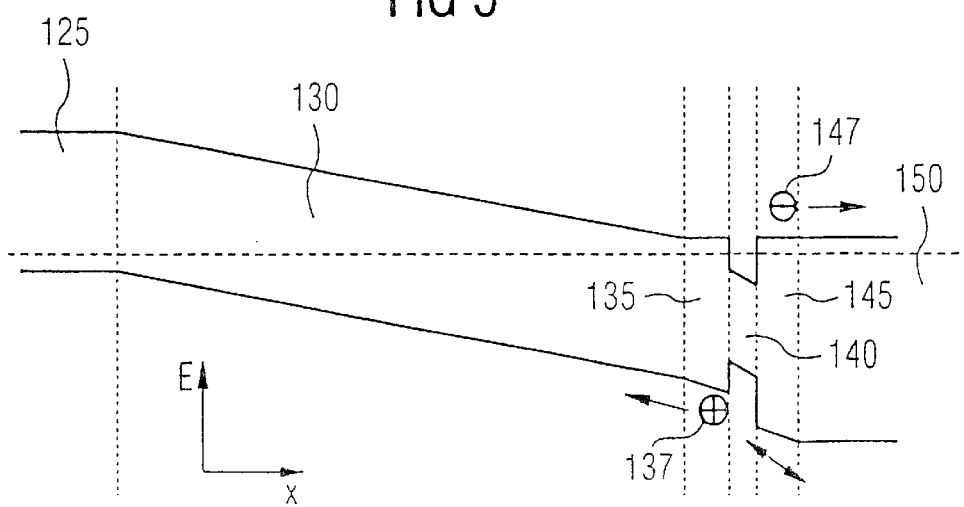
FIG. 5 shows an energy band diagram of a special embodiment.

FIG. 5 shows a simplified energy band diagram, for a special embodiment with a graded doping and an energy band gap in the absorbing layer and the adjoining layers. In this way, it is possible to reduce the absorption inside the thin absorption layer as a consequence of the dopant concentration. Parasitic recombination of the charge carriers can also be avoided at the same time, which leads to very low sensitivities of the detector and a high differential efficiency of the laser, without compromising the contrast in relation to spontaneous emission. The pin photodetector includes a p-doped region 125, an intrinsically conductive doped layer 130, by which the photodetector capacitance is reduced, and an n-doped layer 150. In contrast to conventional potential-well pin diodes, which are known per se, here the absorbing layer 41 is heavily doped with n-type conductivity and is embedded in layers 135 and 145 that are heavily doped with n-type conductivity, in order to reduce the optical absorption. For example, for a reduction in the optical absorption by more than a factor of 3, a dopant concentration of more than $2 \times 10^{18}$ cm$^{-3}$ is required in InGaAs potential wells with an indium content of a few percent. The photocurrent needs to be conducted from the heavily doped zone, in order to prevent the holes 137 from recombining with the electrons 147. In this embodiment of the inventive component, the adjoining heavily doped layers have energy band grading, which leads to a reduction in the energy band gap and therefore, in the direction of the intrinsically doped layer 130, to a reduction in the difference between the valence band and the Fermi level. It is additionally possible to use asymmetric barriers for the thin absorbing layer 140, specifically those with a lower barrier height in the direction of the layer 135, as represented in FIG. 5.

A further possibility consists in altering the electron density in the thin absorbing layer 140 by applying a photodetector voltage such that the depletion zone extends into the absorbing layer. In this way, it is possible to modulate the absorption factor using the applied voltage. By suitably matching the dopant concentration and the thickness of the layer 135, as well that as of the layer 130, it is possible to alter the modulation depth and the DC bias voltage.

We claim:

1. An optoelectronic component serving as a VCSEL, comprising:
   DBR gratings serving as reflectors;
   an active layer disposed between two of said DBR gratings and intended for generating radiation, the radiation having a laser mode with an antinode;
   a photodetector located within one of said DBR gratings and provided with an intrinsically conductive region, a radiation-absorbing layer disposed within said intrinsically conductive region, with said radiation-absorbing layer being configured to overlap the antinode of the laser mode of the radiation; and
   a thick and heavily doped spacer layer located between said active layer and said radiation-absorbing layer adjacent said intrinsically conductive region of said photodetector, said spacer layer being provided with a contact.

2. The component according to claim 1, wherein:
   said laser mode has a photon energy; and
   said radiation-absorbing layer has an energy band edge that is slightly lower than said photon energy of said laser mode.

3. The component according to claim 1, wherein:
   said photodetector and said spacer layer have a nonresonant optical thickness with respect to said laser mode so that an electric field distribution of the radiation inside said DBR gratings remains unmodified.

4. The component according to claim 1, wherein:
   said laser mode has a photon energy; and
   said spacer layer has an energy band edge that is slightly higher than said photon energy of said laser mode.

5. The component according to claim 1, comprising:
   at least one semiconductor layer adjoining said radiation-absorbing layer and being heavily doped to be n-type conductive;
   said spacer layer being heavily doped to be n-type conductive.

6. The component according to claim 5, comprising:
   a region adjacent said radiation-absorbing layer; and
   at least one semiconductor layer adjoining said radiation-absorbing layer and having a grading in an energy band gap so that in said region adjacent said radiation-absorbing layer, the energy band gap grows toward said spacer layer.

7. The component according to claim 6, comprising:
   a depletion layer; and
   a device for applying an electrical voltage to modify an absorption in said radiation-absorbing layer;
   said radiation-absorbing layer lying inside said depletion layer.

8. The component according to claim 6, comprising:
   a depletion layer having an n-doped edge region; and
   a structural device for applying an electrical voltage to modify an absorption in said radiation-absorbing layer;
   said radiation-absorbing layer lying close to said n-doped edge region of said depletion layer.

9. The component according to claim 5, comprising:
   a depletion layer; and
   a device for applying an electrical voltage to modify an absorption in said radiation-absorbing layer;
   said radiation-absorbing layer lying inside said depletion layer.

10. The component according to claim 5, comprising:
    a depletion layer having an n-doped edge region; and
    a structural device for applying an electrical voltage to modify an absorption in said radiation-absorbing layer;
    said radiation-absorbing layer lying close to said n-doped edge region of said depletion layer.

11. The component according to claim 1, wherein: said photodetector is a pin photodiode.

12. The component according to claim 1, wherein:
    said photodetector is selected from a group consisting of a bipolar phototransistor and a heterobipolar phototransistor.

13. The component according to claim 1, wherein:
    said photodetector includes two photodiodes that have a common anode.

14. The component according to claim 1, wherein:
    said photodetector includes two photodiodes that have a common cathode.

15. The component according to claim 1, wherein:
    said photodetector includes two photodiodes that have a common tunnel contact.

* * * * *